(12) United States Patent (10) Patent No.: US 7,071,730 B2
Cordoba (45) Date of Patent: Jul. 4, 2006

(54) VOLTAGE LEVEL TRANSLATOR CIRCUITRY

(75) Inventor: Michael V Cordoba, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/865,725

(22) Filed: Jun. 9, 2004

(65) Prior Publication Data

US 2005/0275389 A1 Dec. 15, 2005

(51) Int. Cl.
*H03K 19/094* (2006.01)

(52) U.S. Cl. ............................................. 326/38
(58) Field of Classification Search .................. 328/68, 328/80, 81; 326/68, 80, 81
See application file for complete search history.

(56) References Cited

U.S. PATENT DOCUMENTS 5,936,428 A 8/1999 Merritt et al. ................ 326/80
6,362,942 B1 * 3/2002 Drapkin et al. ............... 361/90
6,472,905 B1 10/2002 Manning ...................... 326/81
2001/0000654 A1 * 5/2001 Merritt et al. ................ 326/80

* cited by examiner

*Primary Examiner*—Peguy JeanPierre
(74) *Attorney, Agent, or Firm*—Fish & Neave IP Group of Ropes & Gray LLP

(57) ABSTRACT

Circuitry and methods for implementing voltage level translators at relatively low source voltages are provided. The circuitry and methods utilize voltage protection circuitry to ensure that voltages in the circuitry do not exceed predetermined thresholds that, if exceeded, would cause malfunction. In one embodiment of the invention, voltage level translation circuitry is provided to boost voltage from a source voltage (e.g., $V_{CC}$) to a voltage that is higher in potential (e.g., $V_{CCP}$) than the source voltage. In another embodiment of the invention, voltage level translation circuitry is provided to pull a ground voltage down to a potential (e.g., $V_{BB}$) that is lower in voltage than the ground voltage.

52 Claims, 13 Drawing Sheets

US 7,071,730 B2

VOLTAGE LEVEL TRANSLATOR CIRCUITRY

BACKGROUND OF THE INVENTION

This invention generally relates to integrated circuitry and in particular to voltage level translator circuitry implemented in integrated circuitry.

There may be many instances involving integrated circuitry that require the use of voltage level translators to interface circuitry that operates at different voltage levels. For example, a first circuit may transmit voltage signals ranging from a ground voltage $V_{SS}$ (e.g., a "LOW" voltage signal) to a source voltage $V_{CC}$ (e.g., a "HIGH" voltage signal). A second circuit receiving these voltage signals may only register "HIGH" voltage signals that exceed $V_{CC}$. Therefore, a voltage level translator is interfaced between the first and second circuits to translate $V_{CC}$ to a higher voltage $V_{CCP}$ so that the second circuit recognizes the $V_{CC}$ signal provided by the first as a HIGH signal.

As another example, voltage level translators may be used to translate the ground voltage $V_{SS}$ to a lower voltage $V_{BB}$. In this case, the voltage level translator may interface a first circuit, which provides a $V_{SS}$ signal, to a second circuit, which does not recognize $V_{SS}$. Therefore, in order for the second circuit to recognize that the first is providing a LOW signal, the voltage translator changes $V_{SS}$ to $V_{BB}$.

Conventional voltage translator circuitry that accomplishes the above-mentioned voltage level translations are known. However, current design trends involving integrated circuitry is rendering conventional voltage translators obsolete. This is because the source voltage, such as $V_{CC}$, being used in integrated circuitry has decreased to such an extent that existing voltage translators cannot function properly. For example, as source voltages approach 0.8 volts and below, transistors in conventional voltage translators do not turn ON because the source voltage is too low to overcome the voltage threshold needed to activate such transistors. Moreover, even if transistors are used that can be turned ON with low source voltages, conventional circuitry topology does not provide protection against gate oxide breakdown, punch-through, and channel-hot electron effect (e.g., a form of tunneling).

It would therefore be desirable to provide voltage level translation circuitry that operates at low source voltages.

SUMMARY OF THE INVENTION

It is an object of the invention to provide voltage level translation circuitry that operates at low source voltages.

The circuitry according to the invention includes a mixture of thin and thick gate oxide transistors that selectively couple an output node of the circuitry to a predetermined voltage level, such as $V_{CCP}$ or $V_{BB}$, in response to an input signal. The thin gate oxide transistors may be coupled to voltage protection circuitry that prevents voltages being applied to the thin gate transistors from exceeding a predetermined voltage level that, if exceeded, can cause gate oxide breakdown or punch-through.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 2:
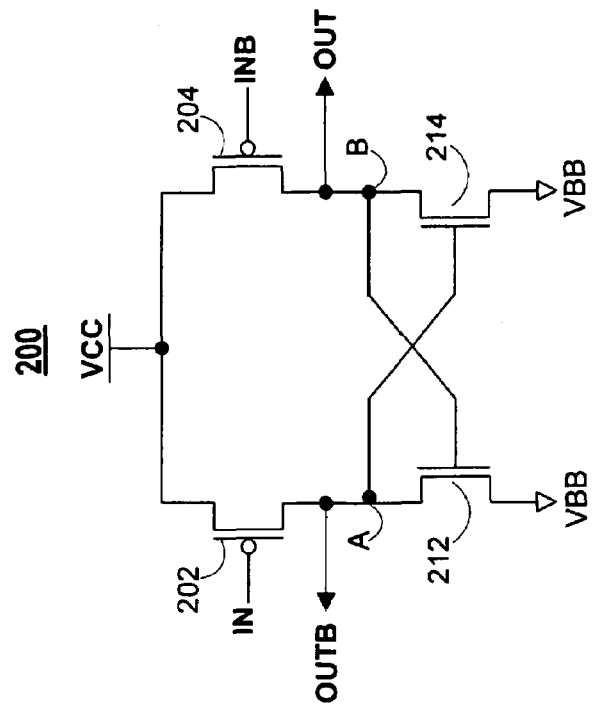
FIG. 2 is a prior art $V_{SS}$ to $V_{BB}$ voltage level translator.

Circuitry and methods according to the invention provide a system that translates an input voltage level to a predetermined output voltage level. In particular, circuitry according to the invention translates voltages while operating at relatively "low" source voltages. Typically, source voltage is the supply voltage being supplied to the circuitry, and is commonly referred to as $V_{CC}$. As defined herein, a "low" source voltage refers to a voltage level of about 0.8 volts and below. The circuitry according to the invention can operate at source voltages ranging, for example, from about 0.4 volts to about 0.8 volts.

It will be understood that advancements in transistor fabrication will result in transistors having lower threshold voltages than transistors being fabricated today. Therefore, it is foreseeable that such transistors can operate at source voltages lower than 0.4 volts. The circuitry of this invention can employ the use such transistors, thereby enabling the use of source voltages lower than 0.4 volts. Although the contents of this disclosure focus on "low" source voltages, it will be understood that the present invention can operate at both "low" and "high" source voltages.

Voltage level translation circuitry according to the invention translates voltages while operating at a low source voltage by using voltage protection circuitry. The voltage protection circuitry biases appropriate nodes in the translation circuitry to prevent punch-through, gate oxide breakdown, and channel hot electron effect. For example, in one embodiment of the invention, a HIGH input signal (e.g., $V_{CC}$) is leveled to an output voltage (e.g., $V_{CCP}$) higher than the voltage of the input signal. In this case, the voltage protection circuitry may bias designated nodes with a predetermined voltage (e.g. $V_{CC}$) to ensure that the drain-to-source voltages, gate-to-source voltages, and gate-to-drain voltages do not exceed the source voltage (in which case punch-through or gate oxide breakdown can occur).

In another embodiment of the invention a LOW input signal (e.g., $V_{SS}$) may be translated to a lower voltage signal (e.g., $V_{BB}$). In this case, voltage protection circuitry may bias one or more designated nodes with a ground voltage to ensure that drain-to-source voltages, gate-to-source voltages, and gate-to-drain voltages do not exceed the source voltage.

The circuitry of the invention may include a mixture of thick gate oxide transistors and thin gate oxide transistors. The thick gate oxide transistors are more impervious to punch-through and gate-oxide breakdown than their thin gate counterparts because the oxide layer is thick enough to withstand gate-to-source voltages and drain-to-source voltages that exceed the source voltage. Thin gate oxide transistors are typically more susceptible to punch-through and gate-oxide breakdown because the oxide layer is thin. A thin gate-oxide is needed, however, to operate at low source voltages. Therefore, the voltage protection circuitry being used in accordance with the invention protects the thin gate transistors.

Figure 1:
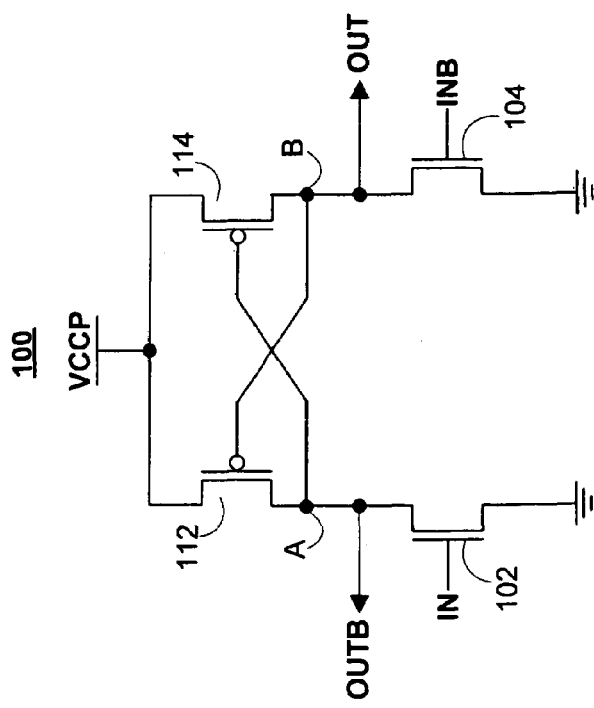
FIG. 1 is a prior art $V_{CC}$ to $V_{CCP}$ voltage level translator.

FIG. 1 shows an example of a prior art $V_{CC}$ to $V_{CCP}$ voltage level translator 100. Voltage translator 100 includes NMOS transistors 102 and 104, which are coupled to PMOS transistors 112 and 114, respectively. Node A, which is formed between PMOS transistor 102 and NMOS transistor 112, is connected to the gate of PMOS transistor 114. Node B, which is formed between PMOS transistor 104 and NMOS transistor 114, is connected to the gate of PMOS transistor 112. The sources of PMOS transistors 112 and 114 are coupled to $V_{CCP}$, which is higher in voltage than the source voltage, and the sources of NMOS transistors 102 and 104 are coupled to ground. Transistors 102, 104, 112, and 114 are all thick gate oxide transistors.

It will be understood that the drain and source orientation of the transistors described herein is not intended to be limiting, but merely illustrative of one way such transistors can be constructed. Therefore, the terms "source" and "drain" are to be interpreted in their broadest sense.

During operation, an input signal is applied to the gate of NMOS transistor 102 and the inverse of the input signal is applied to the gate of NMOS transistor 104. The input signal is shown as IN on FIG. 1, and the inverse of the signal is shown as INB. As defined herein, INB is the inverse of IN. For example, the signal provide on IN may be inverted by an inverter to provide INB. The input signal may range from a LOW voltage signal, which may be obtained from ground or $V_{SS}$, to a HIGH voltage signal, which may be obtained from $V_{CC}$.

When the voltage of the input signal transitions from a LOW voltage to a HIGH voltage, IN goes HIGH and INB goes LOW. A HIGH IN signal activates NMOS transistor 102, which pulls Node A down to ground. The LOW voltage at Node A causes PMOS transistor 114 to turn on, thereby pulling the voltage at Node B up to $V_{CCP}$. NMOS transistor 104 and NMOS transistor 102 remain OFF. Thus, the high input voltage is translated to $V_{CCP}$ (shown as being output as OUT).

The output voltage remains at $V_{CCP}$ until the input signal, IN, transitions from HIGH to LOW and INB transitions from LOW to HIGH. Although translation circuitry 100 translates voltages, it fails to work at low source voltages. This is because transistors 102, 104, 112, and 114 are all thick transistors that require sufficient source voltage (e.g., typically 1.5 volts) to turn ON. Moreover, even if thin gate transistors were substituted in place of transistors 102 and 104, translation circuitry 100 still fails to operate because transistors 102 and 104 would be subject to punch-through. For example, when Node B is pulled up to $V_{CCP}$, the drain-to-source voltage across transistor 104 is $V_{CCP}$. Such a drain-to-source voltage across a thin gate transistor causes the depletion region to extend to the source from the drain, thereby short circuiting the transistor. Furthermore, the gate-to-drain voltage of PMOS transistor 112 is $V_{CCP}$, which can cause gate oxide breakdown.

FIG. 2 shows a prior art $V_{SS}$ to $V_{BB}$ voltage level translator 200. Voltage translator 200 includes PMOS transistors 202 and 204, and NMOS transistors 212 and 214, which are connected as shown in FIG. 2. During operation, when a LOW signal is applied to IN, PMOS transistor 202 is turned ON, which pulls Node A to $V_{CC}$. As Node A goes HIGH, this causes NMOS 214 to turn ON, thereby pulling Node B down to $V_{BB}$, which is lower in voltage than the ground voltage. Node B remains at $V_{BB}$ until the input signal transitions to HIGH and INB goes LOW.

Despite being able to translate a LOW input signal to lower voltage signal, voltage translator fails to work at low source voltages because transistors 202, 204, 212, and 214 are all thick gate transistors. Even if transistors 202 and 204 were substituted with thin gate transistors such transistors will undergo punch-through. For example, when Node B is pulled to $V_{BB}$, the drain-to-source voltage of transistor 204 is equivalent to ($V_{CC}$-$V_{BB}$), which is a voltage potential larger than $V_{CC}$ because $V_{BB}$ is usually a negative voltage. Such a voltage potential across the transistor will cause punch-through, thereby short-circuiting the transistor.

Figure 3:
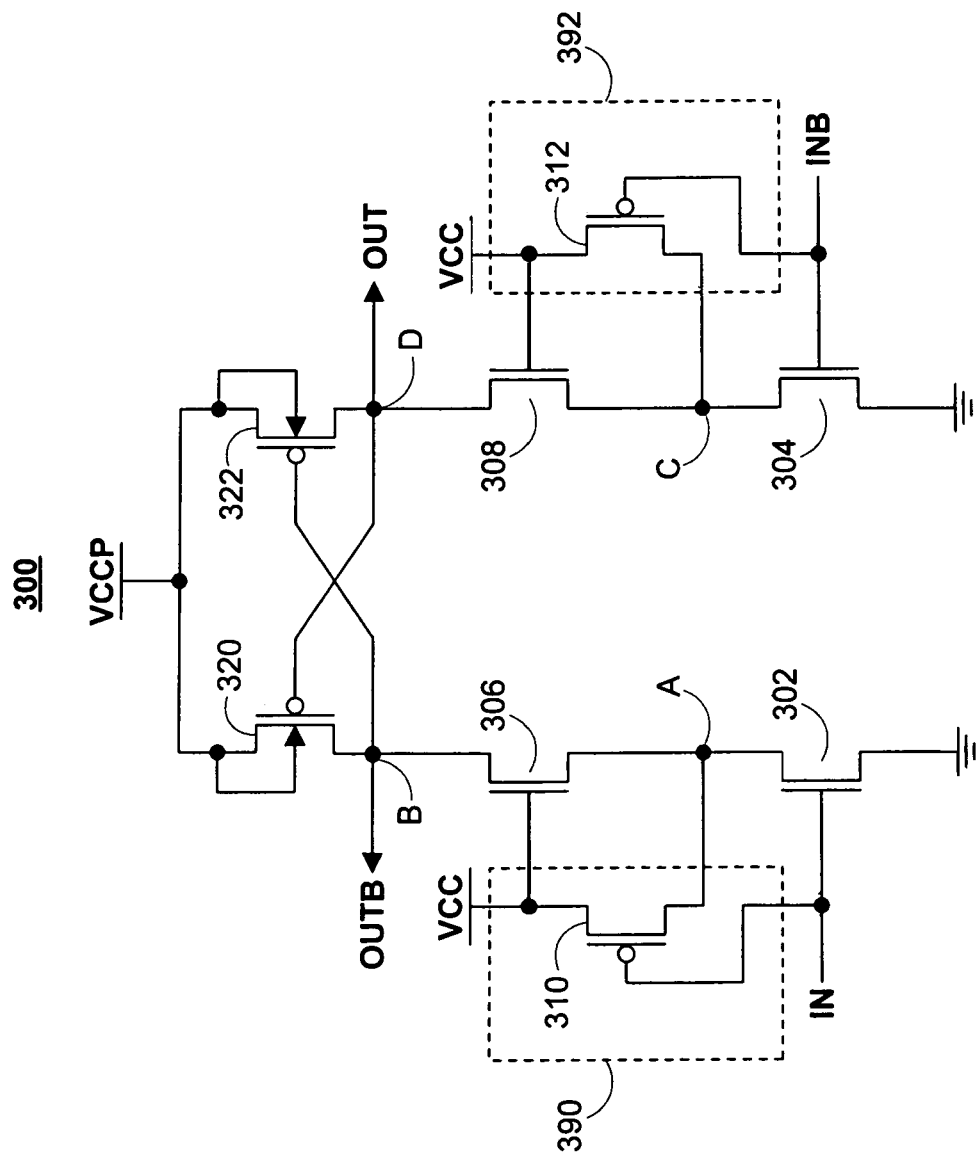
FIG. 3 is a simplified schematic diagram of a $V_{CC}$ to $V_{CCP}$ voltage level translator according the invention.

FIG. 3 shows a simplified schematic diagram of a $V_{CC}$ to $V_{CCP}$ voltage level translator 300 according to the invention. The input signal, IN, is connected to the gates of NMOS transistor 302 and PMOS transistor 310. The drain of NMOS transistor 302 (Node A) is connected to the drain of PMOS transistor 310 and to the source of NMOS transistor 306. The gate of NMOS transistor 306 and the source of PMOS transistor 310 are connected to $V_{CC}$. The drain of NMOS transistor 306 (Node B) is connected to the drain of PMOS transistor 320 and to the gate of PMOS transistor 322. Node B is shown to provide the output OUTB, which may be routed to utilization circuitry (not shown). The source of PMOS transistor 320 is connected to $V_{CCP}$. $V_{CCP}$ has a voltage potential greater than $V_{CC}$, and in low source voltage applications, $V_{CCP}$ preferably does not exceed twice the potential of $V_{CC}$. It is understood that $V_{CCP}$ may be supplied by any suitable source such as a voltage divider, a voltage pump, or an I/O pin that is coupled to an external source that provides a higher voltage than the source voltage.

INB, which carries the inverse of the input signal, is connected to the gates of NMOS transistor 304 and PMOS transistor 312. The drain of NMOS transistor 304 (Node C) is connected to the drain of PMOS transistor 312 and to the source of NMOS transistor 308. The gate of NMOS transistor 308 and the source of PMOS transistor 312 are connected to $V_{CC}$. The drain of NMOS transistor 308 (Node D) is connected to the drain of PMOS transistor 322 and to the gate of PMOS transistor 320. Node D is shown to provide the output OUT, which may be provided to utilization circuitry (not shown). The source of PMOS transistor 322 is connected to $V_{CCP}$.

The voltage protection circuitry of the invention is shown to be outlined by dashed boxes 390 and 392. It is understood that while voltage protection circuitry of voltage level translator 300 is shown to include a transistor, other circuit configurations may be implemented to ensure proper operation at low source voltages.

Figure 4A:
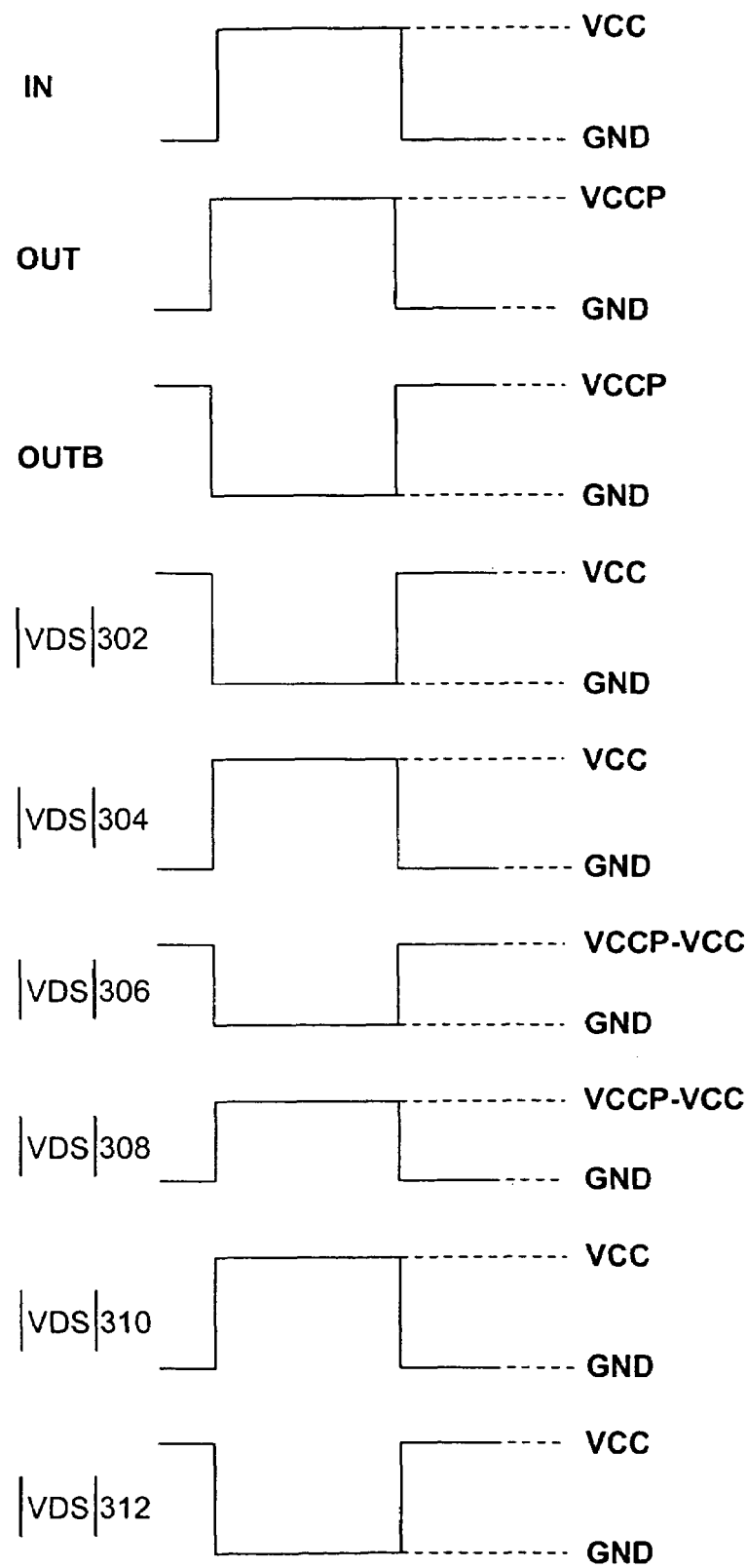
FIGS. 4A, 4B, and 4C show voltage waveforms of different modes of operation of the voltage level translator of FIG. 3 according to the invention.
Figure 4B:
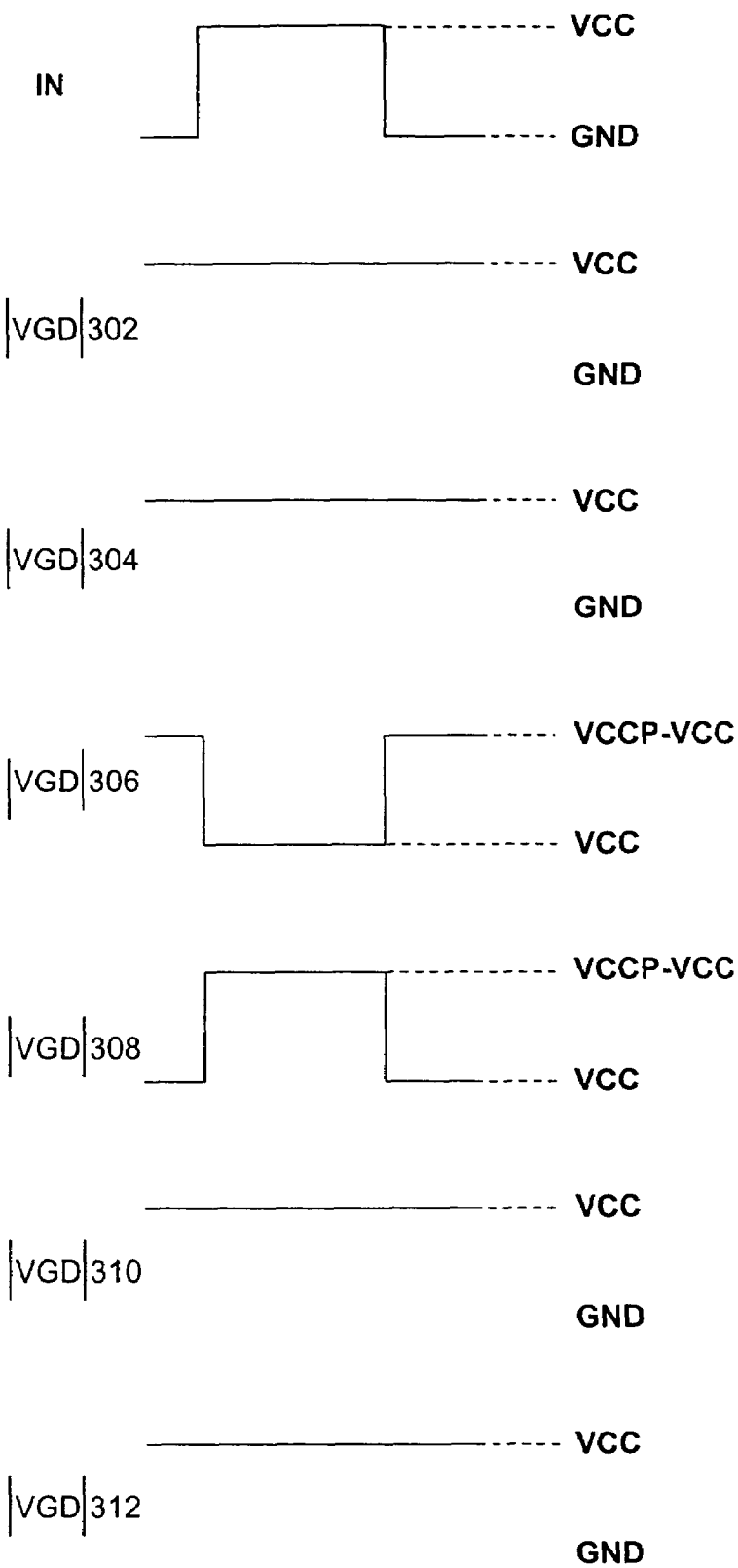
Figure 4C:
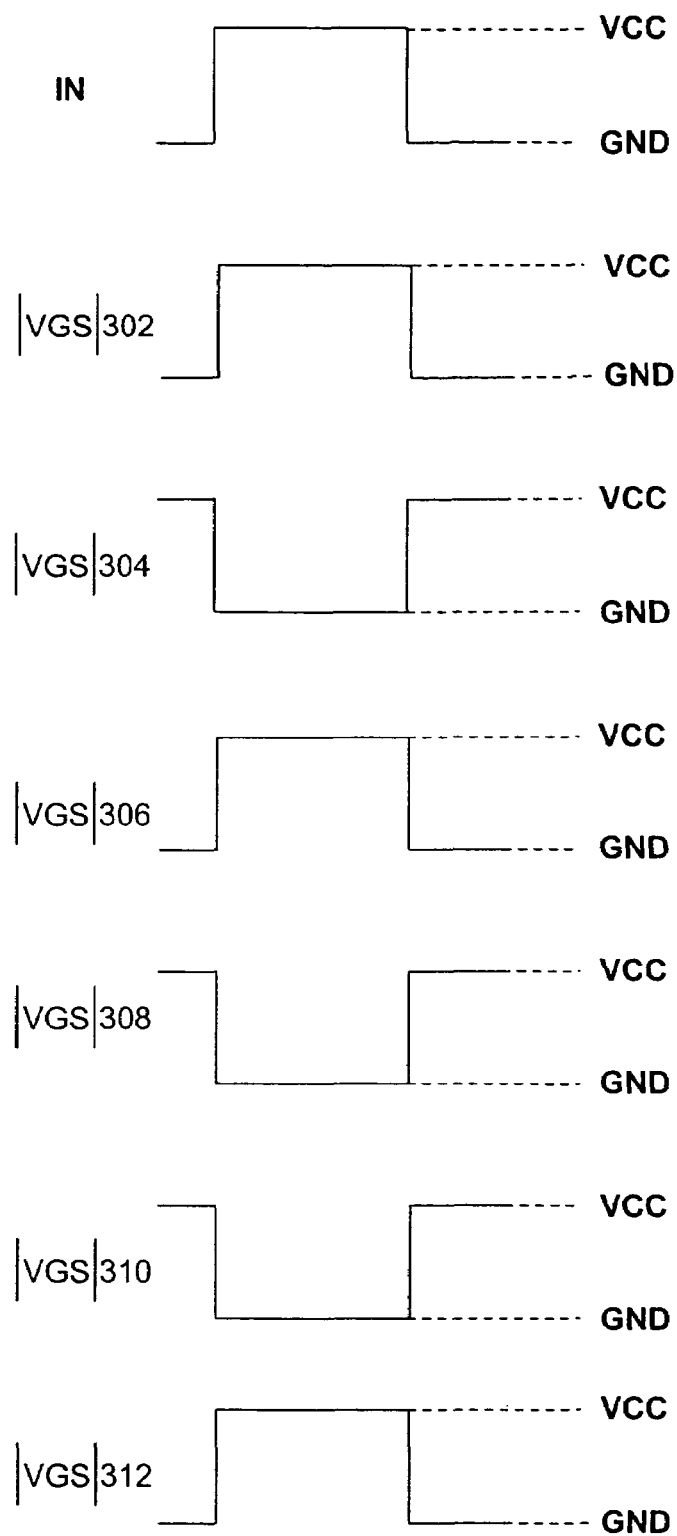

In operation, voltage level translator 300 operates to produce output signals OUT and OUTB in response to the input signal, such as that shown in FIGS. 4A, 4B, and 4C. The input signal, IN, is shown as an illustrative square wave to simulate a switching condition that can be applied to voltage level translator 300. (Note that INB is not shown, but it is understood that it is the inverse of IN.) FIG. 4 also shows voltage waveforms that illustrate voltages being applied to transistors 302, 304, 306, 308, 310, and 312 during operation. In particular, the waveforms show the absolute value of the drain-to-source voltages, the absolute value of the gate-to-source voltages, and absolute value of the gate-to-drain voltages of these transistors.

It is noted that because FIG. 4 shows the absolute value of the voltage across various nodes of a particular transistor, the polarity (e.g., positive and negative) of the voltages is not shown. For example, there may be instances in which the gain-to-drain voltage or gate-to-source voltage is a negative voltage (e.g., $-V_{CC}$), but because the absolute values are shown in FIG. 4, this negative voltage is shown as a positive voltage. Therefore, in instances where the voltage across two terminals of a transistor switches between a negative voltage and a positive voltage, FIG. 4 does not show the voltage transition because only the absolute values of the voltages is shown.

In operation, a HIGH input signal causes translator 300 to provide an output OUT that is substantially equal to $V_{CCP}$. For example, when a HIGH input voltage of about 0.8 volts (e.g., $V_{CC}$) is applied to IN, the translated output voltage may be 1.5 volts e.g., $V_{CCP}$). When a LOW input signal is applied, translator 300 may provide an output OUT that is substantially equal to ground. Note that the output OUT is a square wave that substantially matches the input signal. This is possible because the circuit configuration of voltage translator 300 optimally translates input signals with minimal delay.

Referring to FIG. 3 and FIG. 4, the operation of voltage translator 300 is now described. When the state of the input signal applied to IN transitions from LOW to HIGH, the HIGH signal on IN activates NMOS transistor 302 and deactivates PMOS transistor 310. When NMOS transistor 302 activated, Node A is pulled to ground, causing NMOS transistor 306 to turn ON, which pulls Node B to ground. The LOW signal at Node B activates PMOS transistor 322 and pulls OUT to $V_{CCP}$.

The LOW signal on INB deactivates NMOS transistor 304 and activates PMOS transistor 312. (INB is LOW because it is the inverse of the signal on IN.) Activation of PMOS transistor 312 pulls the voltage at Node C up to $V_{CC}$. Thus, the voltage across NMOS transistor 304 is $V_{CC}$. As Node C is pulled up to $V_{CC}$, NMOS 308 is turned OFF, resulting in a $V_{DS}$ being substantially equal to ($V_{CCP}-V_{CC}$). Transistor 320 is deactivated as OUT (Node D) is pulled to $V_{CCP}$.

At this point in the operation of voltage translator 300, OUT is at VCCP and OUTB is at ground. These outputs remain this way until the input signal transitions from HIGH to LOW. When the input signal transitions from HIGH to LOW, a LOW signal is applied to IN and a HIGH signal is applied to INB. A HIGH signal on INB turns NMOS transistor 304 ON and turns PMOS transistor 312 OFF. Once NMOS transistor 304 is activated the voltages at Nodes C and D are driven to ground via the pathway created by activated NMOS transistor 304 and activated NMOS transistor 308. The output OUT is now at ground, thereby turning PMOS transistor 320 ON, which causes Node B to pulled up to $V_{CCP}$.

The LOW signal on IN turns NMOS 302 OFF and turns PMOS 310 ON. When PMOS 310 is ON, Node A is pulled up to $V_{CC}$, thereby turning NMOS 306 OFF. With Node B at $V_{CCP}$, PMOS 322 is turned OFF. Note that the output OUTB is now at $V_{CCP}$.

NMOS transistors 302, 304, 306, and 308 and PMOS transistors 310 and 312 are thin gate oxide transistors. PMOS transistors 320 and 322 are thick gate oxide transistors. Thin gate transistors have lower threshold voltages $V_T$ than thick gate transistors, and thus are better suited for low voltage applications than their thick gate counterparts. Moreover, thin gate oxides have other advantages over thick gate oxides such as faster response, higher current conduction, and smaller size.

As indicated by FIG. 4, the absolute values of $V_{DS}$, $V_{GS}$, and $V_{GD}$ of the thin gate transistors do not exceed $V_{CC}$. For example, during the LOW-to-HIGH input signal transition, PMOS transistor 312 prevents the $V_{DS}$ of NMOS transistors 304 and 308 from exceeding $V_{CC}$. As Node D approaches $V_{CCP}$, this will tend to cause Node C to approach $V_{CCP}$, which can result in application of too much voltage to the drain of NMOS 304, potentially causing it to undergo punch-through. However, Node C is prevented from approaching $V_{CCP}$ because of the voltage protection provided by PMOS 312. When PMOS 312 is turned ON Node C is pulled up to $V_{CC}$, and because the gate of NMOS 308 is tied to $V_{CC}$, NMOS 308 will turn OFF when Node C is at $V_{CC}$. Thus, the $V_{DS}$ of NMOS 304 is maintained at $V_{CC}$ and the $V_{DS}$ of NMOS 308 is $V_{CCP}-V_{CC}$. The $V_{GD}$ of NMOS transistor 308 is $V_{CCP}-V_{CC}$ and the $V_{GD}$ of NMOS transistor 304 is $V_{CC}$.

Also, when a HIGH signal is being applied to IN, the $V_{GD}$ of NMOS transistors 302 and 306 does not exceed $V_{CC}$. Rather the $V_{GD}$ of both transistors is held to $V_{CC}$. Note that the $V_{GS}$ and the $V_{DS}$ of PMOS transistors 310 and 312 do not exceed $V_{CC}$ when a HIGH signal is being applied on IN.

It will be understood that during the HIGH-to-LOW input signal transition, PMOS transistor 310 turns ON to pull Node A up to $V_{CC}$ to protect transistors 302 and 306 in a manner similar to that described above to prevent gate oxide breakdown, punch-through, and channel hot electron effect.

PMOS transistor 320 and PMOS transistor 322 may be p-type transistors that have their respective n-wells connected to $V_{CCP}$. This is sometimes called a "well-tie" and is shown in FIG. 3 where the well of the transistor is connected to $V_{CCP}$. As is known in the art, an n-well may be an n-doped region (within a p-substrate) that is doped with two p+ regions, where the p+ regions form the drain and source. Connecting the n-well to $V_{CCP}$ may, for example, increase the response time of the transistors and provide a basis for using smaller sized transistors. It is understood that different PMOS structures can be constructed and that the foregoing transistor construction is not intended to be limiting.

Figure 5:
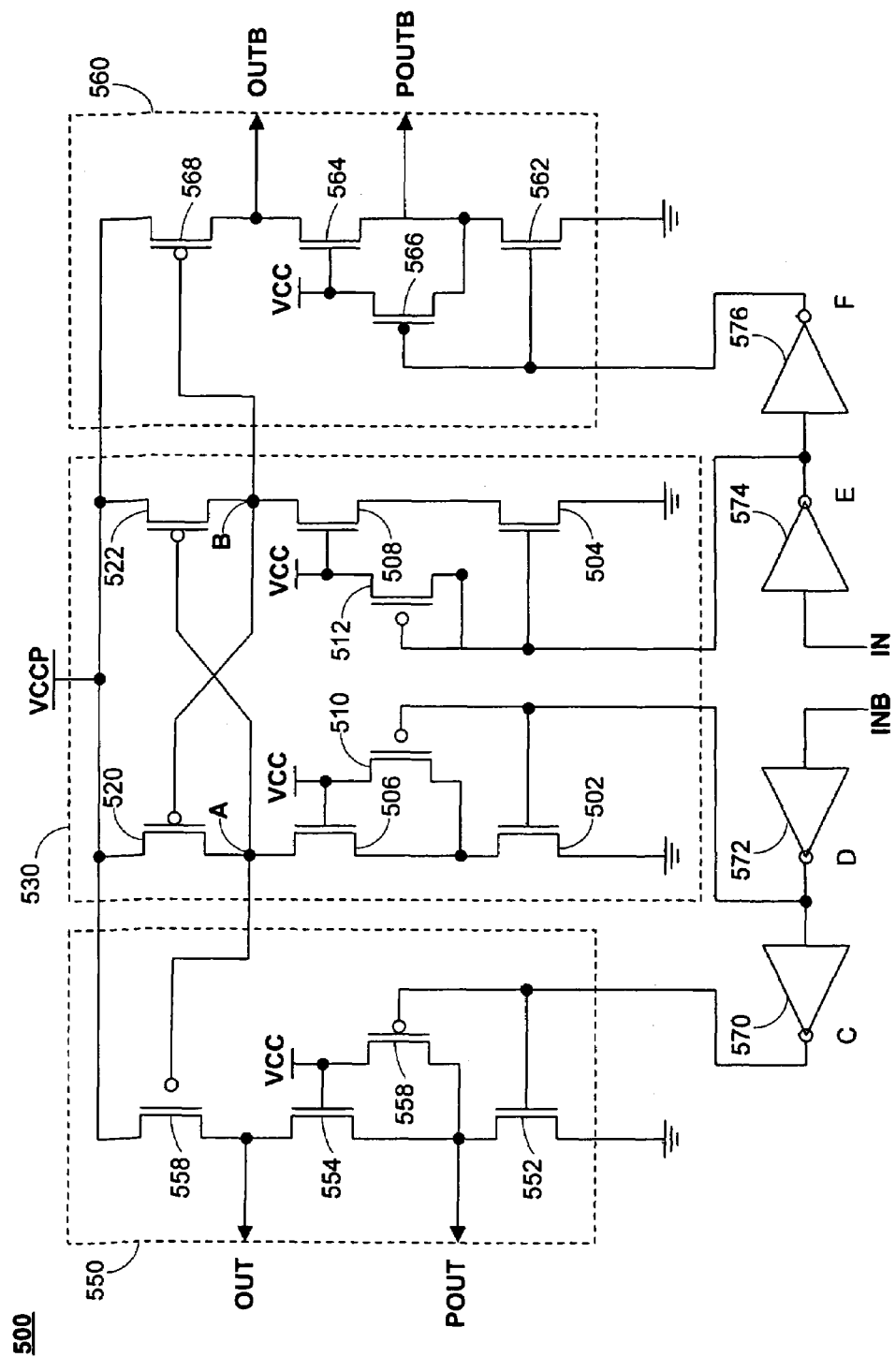
FIG. 5 is a schematic diagram of one embodiment of a $V_{cc}$ to $V_{CCP}$ voltage level translator according to the invention.

FIG. 5 shows a schematic diagram of $V_{CCP}$ voltage translation circuitry 500 being used in combination with a buffer in accordance with the invention. Circuitry 500 includes circuitry similar to voltage translator circuitry 300, which is shown in FIG. 5 as translation circuitry 530. The transistors used in translation circuitry 530 are arranged similar to that of translator 300. Thus, their connections need not be repeated here. The outputs of translation circuitry 530, Node A and Node B, are buffered by buffer circuitry 550 and 560, respectively. Such buffering may be advantageous because it isolates the translation circuitry from utilization circuitry (not shown). Other advantages realized by using buffer circuitry include faster switching times, especially if the utilization circuitry is a "heavy" load. Inverter circuitry 570, 572, 574, and 576 are included in circuitry 500 to coordinate application of the input signals being applied on the IN and INB leads.

Table 1, below, shows the steady-state outputs (e.g., Nodes A and B, OUT, OUTB, POUT, and POUTB) provided by circuitry 500 depending on which input signal is being applied.

TABLE 1

|  | IN = HIGH<br>INB = LOW | IN = LOW<br>INB = HIGH |
| --- | --- | --- |
| Node A | GND | VCCP |
| Node B | VCCP | GND |
| OUT | VCCP | GND |
| OUTB | GND | VCCP |
| POUT | VCC | GND |
| POUTB | GND | VCC |

FIG. 5 shows that INB is coupled to inverter 572 and that IN is coupled to inverter 574. The output of inverter 572 (Node D) is coupled to the input of inverter 570 and the gates of NMOS transistor 502 and PMOS transistor 510. The output of inverter 574 (Node E) is coupled to the input of inverter 576 and the gates of NMOS transistor 504 and PMOS transistor 512. Thus, the signals on Nodes D and E drive translation circuitry 530.

The outputs of inverters 570 and 576 (Nodes C and F, respectively) drive buffer circuitry 550 and 560, respectively. Node C is coupled to the gates of NMOS transistor 552 and PMOS transistor 556. Node F is coupled to the gates of NMOS transistor 562 and PMOS transistor 566.

Buffer circuitry 550 and 560 may include a transistor arrangement constructed similar to a portion of translation circuitry 530 to prevent, for example, gate oxide breakdown and punch-through of the thin gate transistors included in the buffer circuitry. The drain of NMOS transistor 552 is connected to the source of NMOS transistor 554 and to the drain of PMOS transistor 556. The node between NMOS transistor 552 and NMOS transistor 554 is where the output POUT is provided. The source of PMOS transistor 556 and the gate of NMOS transistor 554 are connected to $V_{CC}$. The drain of PMOS transistor 558 is connected to the drain of NMOS transistor 554. The node formed at this connection provides the output OUT. The source of PMOS transistor 558 is connected to $V_{CCP}$ and its gate is connected to Node A.

NMOS transistor 562, NMOS transistor 564, PMOS transistor 566, and PMOS transistor 568 of buffer circuitry 560 have similar connections as transistors 552, 554, 556, and 558 of buffer circuitry 550, with a few differences in connections. The output POUTB is obtained from the node formed between NMOS transistor 562 and NMOS transistor 564. The output OUTB is obtained from the node formed between NMOS transistor 564 and PMOS transistor 568. The gate of PMOS transistor 568 is connected to Node B.

Note that the wells of PMOS transistors 520, 522, 558, and 568 may be connected to $V_{CCP}$.

Note that transistors 506 and 508 operate in a similar manner as transistors 306 and 308 shown in FIG. 3.

With reference to TABLE 1 and FIG. 5, operation of circuitry 500 is now described. When a HIGH input signal is applied to the IN lead, the inverse of the signal is applied to the INB lead. The LOW signal on INB is inverted by inverter 572, resulting in a HIGH signal that causes Node A to be pulled to ground. As node A is pulled to ground, this turns PMOS 522 ON, thereby pulling Node B up to $V_{CCP}$. The HIGH voltage at Node B turns PMOS transistor 520 and PMOS transistor 568 OFF.

PMOS transistor 558 is turned ON when Node A goes to ground. When PMOS transistor 558 is ON, OUT is pulled up to $V_{CCP}$. POUT is pulled up to $V_{CC}$ because the LOW signal at Node C causes PMOS transistor 556 to turn ON, resulting in the application of $V_{CC}$ to POUT. Both OUTB and POUTB are pulled down to ground because a HIGH signal at Node F causes NMOS transistors 562 and 564 to turn ON, thereby providing a pathway to ground.

It is understood that circuitry 500 can maintain the outputs shown in the left hand column of TABLE 1 until the input signal transitions from HIGH-to-LOW, at which point the outputs of circuitry 500 can provide the voltages shown in the right hand side of TABLE 1.

Figure 6:
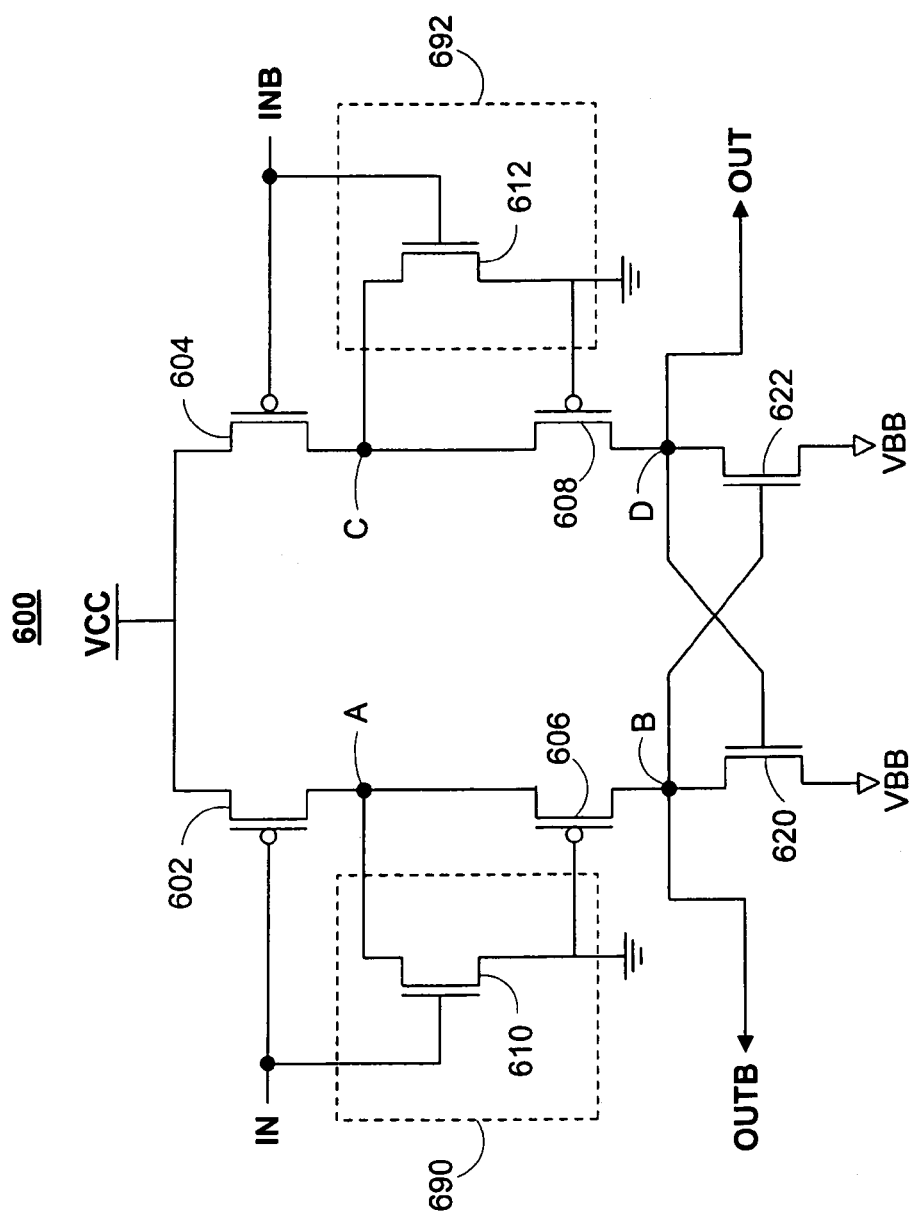
FIG. 6 is a simplified schematic diagram of a $V_{SS}$ to $V_{BB}$ voltage level translator according the invention.

FIG. 6 is a simplified schematic diagram of a $V_{SS}$ to $V_{BB}$ voltage level translator 600 according the invention. In general, translator circuitry 600 translates a LOW input signal to a lower input signal, which is usually a negative voltage. HIGH input signals are typically not translated by circuitry 600 but are output as $V_{CC}$. An advantage of circuitry 600 is that it translates LOW input signals while operating at low source supply voltages such as 0.8 volts and less. Circuitry 600 accomplishes this using a combination of thick gate oxide transistors and thin gate oxide transistors, with the thin gate transistors being arranged to minimize $V_{DS}$ and $V_{GS}$. More particularly, circuitry 600 may utilize voltage protection circuitry in accordance with invention to prevent deleterious transistor operation.

An input signal is received on leads IN and INB. INB is the inverse of the signal received on lead IN. An inverter (not shown) may be used to invert the input signal being supplied to INB. IN is connected to the gates of PMOS transistor 602 and NMOS transistor 610, whereas INB is connected to the gates of PMOS transistor 604 and NMOS transistor 612. The sources of PMOS transistors 602 and 604 are connected to $V_{CC}$. The drain (Node A) of PMOS 602 is coupled to the drain of NMOS transistor 610 and to the source of PMOS transistor 606. The gate of PMOS transistor 606 is connected to ground. The drain of PMOS transistor 606 (Node B) is connected to the drain of NMOS transistor 620, the source of which is connected $V_{BB}$. Node B is connected to the gate of NMOS transistor 622. Node B is the node where output OUTB is provided. Node D, which is formed between the drain of NMOS transistor 622 and the drain of PMOS transistor 608, is connected to the gate of NMOS transistor 620. Node D is where the output OUTB is provided. The source of NMOS transistor 622 is connected to $V_{BB}$. The source of PMOS transistor 608 is connected to the drain of PMOS transistor 604 and its gate is connected to ground. Note that PMOS transistors 606 and 608 are biased to be ON because their gates are tied to ground.

Voltage protection circuitry is shown to be included in boxes 690 and 692. It is understood that while the voltage protection circuitry shown in translator 600 includes transistors, the voltage protection circuitry is not limited to this particular configuration.

Figure 7A:
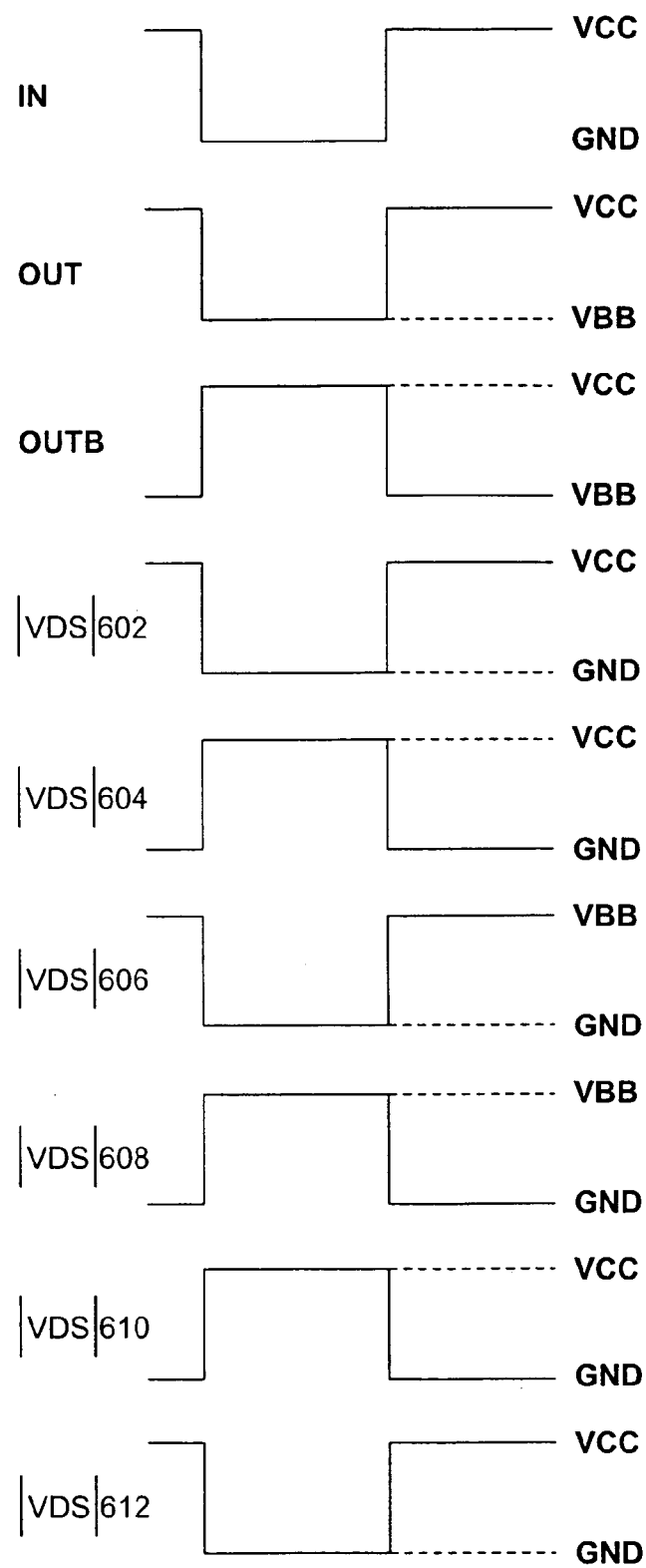
FIGS. 7A, 7B, and 7C show voltage waveforms of different modes of operation of the voltage level translator of FIG. 6 according to the invention.
Figure 7B:
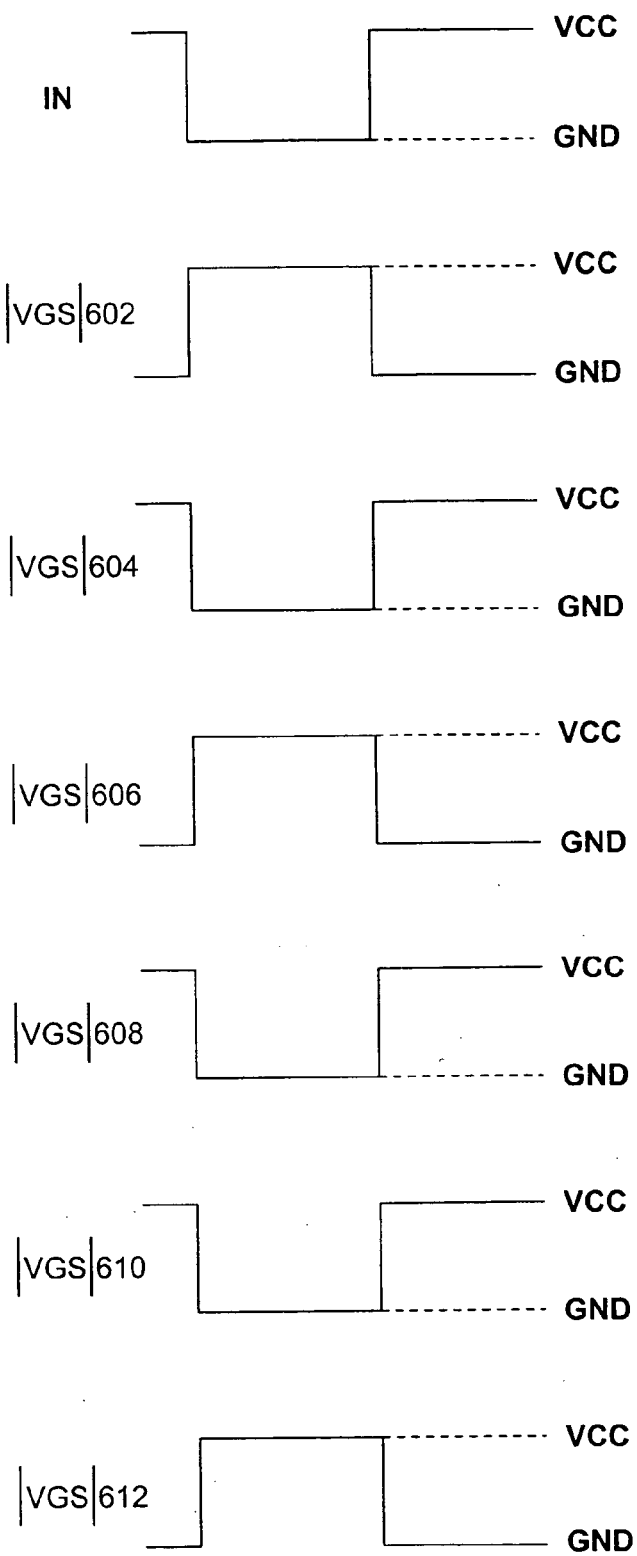
Figure 7C:
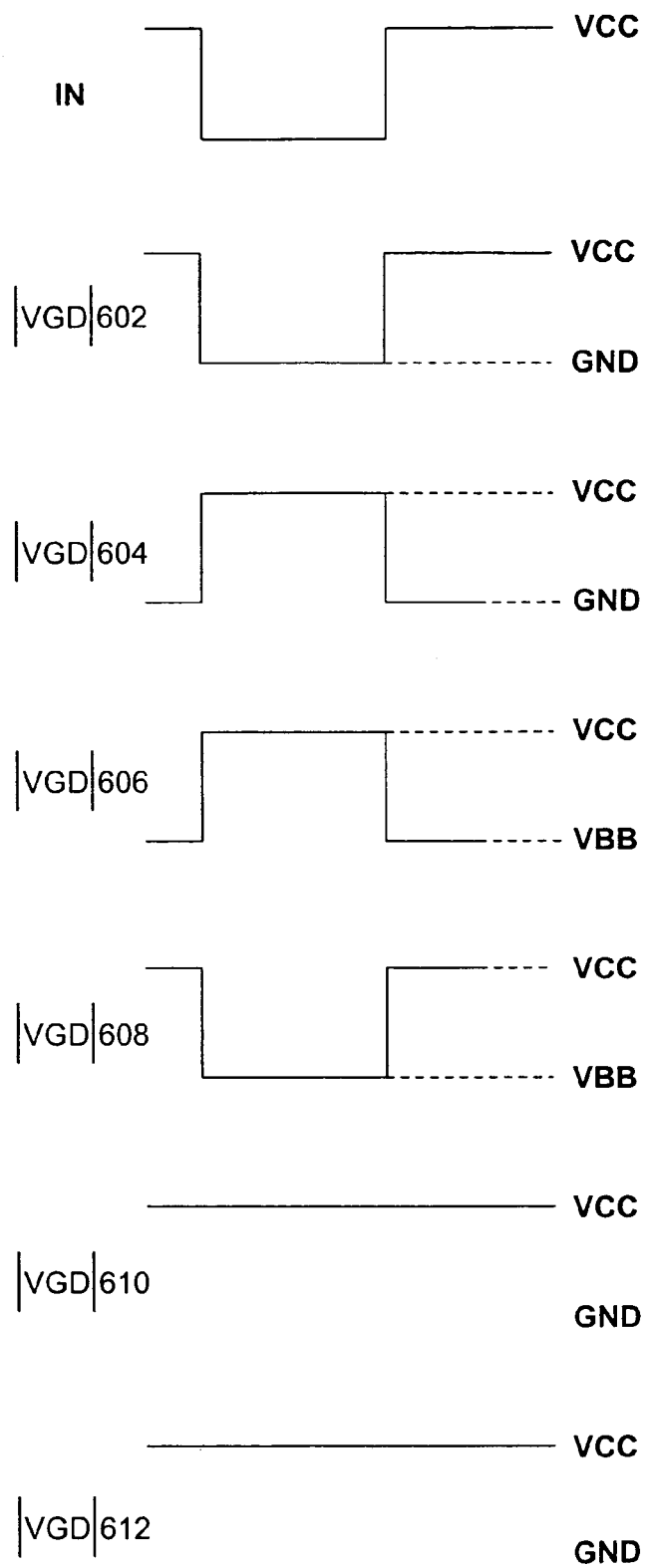

During operation, voltage level translator 600 produces output signals in response to input signals, such as that shown in FIGS. 7A, 7B, and 7C. The input signal is shown as an illustrative square wave to simulate a switching condition that can be applied to voltage level translator 600. FIG. 7 also shows voltage waveforms that illustrate voltages being applied to transistors 602, 604, 606, 608, 610, and 612 during operation. In particular, the waveforms show the absolute value of the drain-to-source voltages, the absolute value of the gate-to-source voltages, and the absolute value of the gate-to-drain voltages of the transistors.

It is understood that because the absolute value of the voltages is being shown in FIG. 7, the polarity of the voltages is not shown.

During operation, circuitry 600 outputs a lower voltage level when it receives a low voltage input signal. For example, when a LOW input voltage of about 0 volts (e.g., ground or $V_{SS}$) is applied to IN, the translated output voltage may be −0.8 volts (e.g., $V_{BB}$). In low source voltage applications of translator 600, the absolute value of the potential of $V_{BB}$ preferably does not exceed the absolute value of the potential of $V_{CC}$. When a HIGH input signal (e.g., $V_{CC}$) is applied, translator 300 may provide an output OUT that is substantially equal to $V_{CC}$. Note that the output OUT is a square wave that substantially matches the input signal. This is possible because the circuit configuration of voltage translator 600 optimally translates input signals with minimal delay.

With reference now to both FIG. 6 and FIG. 7, the operation of voltage translator 600 is now described. During a HIGH-to-LOW transition, a LOW signal is applied to IN and a HIGH signal is applied to INB. The LOW signal (on IN) turns PMOS transistor 602 ON, which pulls Node A up to $V_{CC}$. Node B is also pulled up to $V_{CC}$ because PMOS transistor 606 is biased to be turned ON. When Node B is pulled to $V_{CC}$, this turns NMOS transistor 622 ON, which pulls OUT (Node D) down to $V_{BB}$. The HIGH signal on INB turns PMOS transistor 604 OFF and turns NMOS transistor 612 ON, which pulls Node C to ground. As Node D is pulled to $V_{BB}$, PMOS 608 turns OFF. The LOW voltage on Node D turns NMOS transistor 620 OFF.

When the input signal switches from LOW to HIGH, a HIGH signal is applied to IN and a LOW signal is applied to INB. The HIGH signal deactivates PMOS transistor 602, thereby cutting Node A and Node B off from $V_{CC}$. The HIGH signal turns NMOS 610 ON, which pulls Node A and Node B, initially, down to ground, thereby shutting NMOS transistor 622 OFF. The LOW signal being applied on INB results in Node D (OUT) being pulled to VCC, resulting in turning NMOS transistor 620 ON. Once ON, OUTB is pulled to $V_{BB}$.

PMOS transistors 602, 604, 606, and 608 and NMOS transistors 610 and 612 may be thin gate oxide transistors, whereas NMOS transistors 620 and 622 may be thick gate oxide transistors. If desired, NMOS transistors 620 and 622 may have their p-wells tied to VBB to minimize transistor size and improve response time.

NMOS transistors 610 and 612 may function as voltage protection circuitry to prevent the source-to-drain voltages, gate-to-drain voltages, and the gate-to-source voltages on PMOS transistors 602, 604, 606, and 608 from exceeding VCC, as shown in FIG. 7. More specifically, NMOS transistor 610 protects transistors 602 and 606 when the input signal on IN is HIGH, and NMOS transistor 612 protects transistors 604 and 608 when the input signal on INB is HIGH.

For example, when INB is HIGH, NMOS transistor 612 pulls Node C to ground. As a result, the $V_{DS}$ of PMOS 604 is |$V_{CC}$−ground| and the $V_{DS}$ of PMOS transistor 608 is |$V_{BB}$−ground|. The $V_{GS}$ of PMOS transistor 604 is about 0 volts, which obtained by subtracting the potential of the HIGH input signal (e.g., $V_{CC}$) on IN from $V_{CC}$. The $V_{GS}$ of PMOS transistor 608 is also about 0 volts, which is obtained from subtracting the voltage at Node C from ground. The $V_{GD}$ of PMOS transistor 608, however, is $V_{BB}$. While a LOW signal is being applied to IN, the $V_{GS}$ of PMOS transistors 602 and 606 is $V_{CC}$, and the $V_{DS}$ of PMOS transistors 602 and 606 is about 0 Volts.

Note that the voltages being applied to the voltage protection circuitry (e.g., transistors 610 and 612) do not exceed $V_{CC}$.

Figure 8:
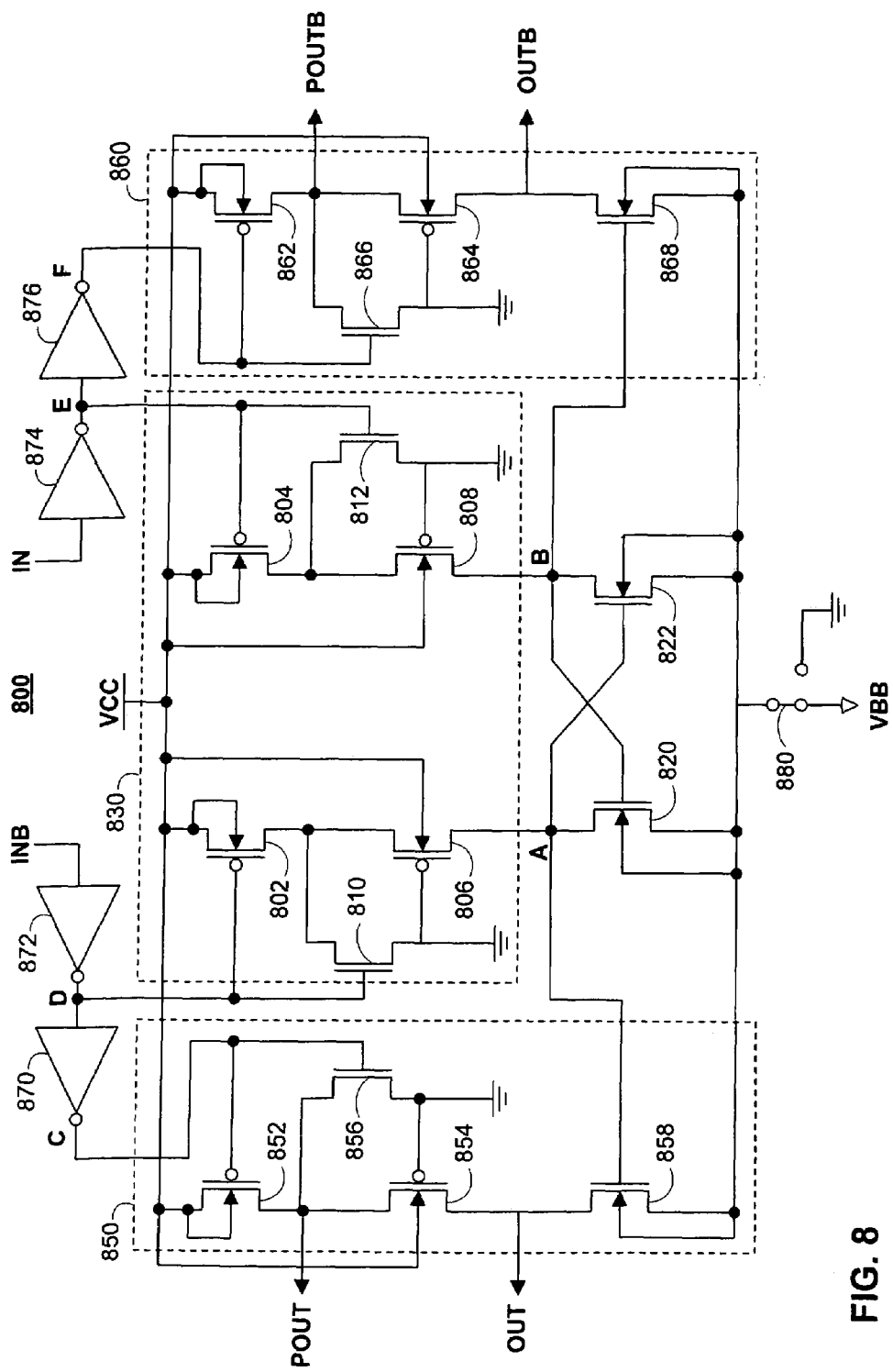
FIG. 8 is a schematic diagram of one embodiment of a $V_{SS}$ to $V_{BB}$ voltage level translator according to the invention.

FIG. 8 is a schematic diagram of a $V_{SS}$ to $V_{BB}$ voltage level translator 800 being used in connection with a buffer according to the invention. Circuitry 800 includes circuitry similar to voltage translator circuitry 600, which is shown in FIG. 8 as translation circuitry 830. The transistors used in translation circuitry 830 are arranged similar to that of voltage translator 600. Thus, their connections need not be repeated here. The outputs of translation circuitry 830, Node A and Node B, are buffered by buffer circuitry 850 and 860, respectively. Inverter circuitry 870, 872, 874, and 876 are included in circuitry 800 to coordinate application of the input signals being applied on the IN and INB leads.

Table 2, below, shows the steady-state outputs provided by circuitry 800 depending on which input signal is being applied.

TABLE 2

|  | IN = LOW<br>INB = HIGH | IN = HIGH<br>INB = LOW |
|---|---|---|
| Node A | VCC | VBB |
| Node B | VBB | VCC |
| OUT | VBB | VCC |
| OUTB | VCC | VBB |
| POUT | GND | VCC |
| POUTB | VCC | GND |

FIG. 8 shows that INB is coupled to inverter 872 and that IN is coupled to inverter 874. The output of inverter 872 (Node D) is coupled to the input of inverter 870 and the gates of NMOS transistor 802 and PMOS transistor 810. The output of inverter 874 (Node E) is coupled to the input of inverter 876 and the gates of NMOS transistor 804 and PMOS transistor 812. The signals on Nodes D and E drive translation circuitry 830.

The outputs of inverters 870 and 876 (Nodes C and F, respectively) and Nodes A and B drive buffer circuitry 850 and 860, respectively. Node C is coupled to the gates of PMOS transistor 852 and NMOS transistor 856. Node F is coupled to the gates of PMOS transistor 862 and NMOS transistor 866.

Buffer circuitry 850 and 860 may include a transistor arrangement constructed similar to that of translation circuitry 830 to prevent, for example, gate oxide breakdown and punch-through. As shown, the source of PMOS transistor 852 is connected to $V_{CC}$ and its drain is connected to the source of PMOS transistor 854. The node between PMOS transistor 852 and PMOS transistor 854 is where the output POUT is provided, and it is also connected to the drain of NMOS transistor 856. The source of NMOS transistor 856 and the gate of PMOS transistor 854 are connected to ground. The drain of NMOS transistor 858 is connected to the drain of PMOS 854, where a node formed between this connection provides the output OUT. The source of NMOS transistor 858 is connected to $V_{BB}$ and the gate is connected to Node A.

Buffer circuitry 860 is connected in a manner similar to that of buffer circuitry 850, except for a few differences. The output POUTB is obtained from the node formed between PMOS transistor 862 and PMOS transistor 864. The output OUTB is obtained from the node formed between PMOS transistor 864 and NMOS transistor 868. The gate of NMOS transistor 868 is connected to Node B.

NMOS transistors 820, 822, 858, and 868 may have their p-wells tied to $V_{BB}$. PMOS transistors 802, 804, 806, 808, 852, 854, 862, and 864 may have their n-wells tied to $V_{CC}$. Switch 880 may be included to switch between $V_{BB}$ and ground as desired.

With reference to TABLE 2 and FIG. 8, operation of circuitry 800 is now described. When a LOW input signal is applied on to IN, the inverse of the that signal is applied on INB. The HIGH signal on INB is inverted by inverter 872, resulting in a LOW signal that pulls Node A to VCC. As node A is pulled to VCC, this turns NMOS transistor 822 ON, causing Node B to be pulled down to $V_{BB}$. The LOW voltage at Node B turns NMOS transistor 820 and NMOS transistor 868 OFF.

NMOS 858 is turned ON when Node A is pulled up to $V_{CC}$. When NMOS 858 is ON, OUT is pulled up to $V_{BB}$. POUT is pulled down to ground because the HIGH signal at Node C causes NMOS transistor 856 to turn ON, pulling POUT to ground. Both OUTB and POUTB are pulled to $V_{CC}$ because a LOW signal at Node F causes PMOS transistor 862 and PMOS transistor 864 to turn ON, thereby providing a pathway to $V_{CC}$.

It is understood that circuitry 800 can maintain the outputs shown in the left hand column of TABLE 2 until the input signal transitions from LOW-to-HIGH, at which point the outputs of circuitry 800 can provide the voltages shown in the right hand side of TABLE 2.

The various voltage level translator circuitry embodiments, and variations thereof, can be used in a variety of applications. For example, voltage translation circuitry according to the invention can be used in memory circuits, such as DRAMs. As another example, voltage level translation circuitry may drive utilization circuitry that provides an output voltage that ranges from $V_{BB}$ to $V_{CCP}$. If desired, the utilization circuitry may provide $V_{BB}$ in response to the translation circuitry receiving a HIGH input signal. It is understood that several permutations of output voltages generated in response to input signals can be achieved.

Figure 9:
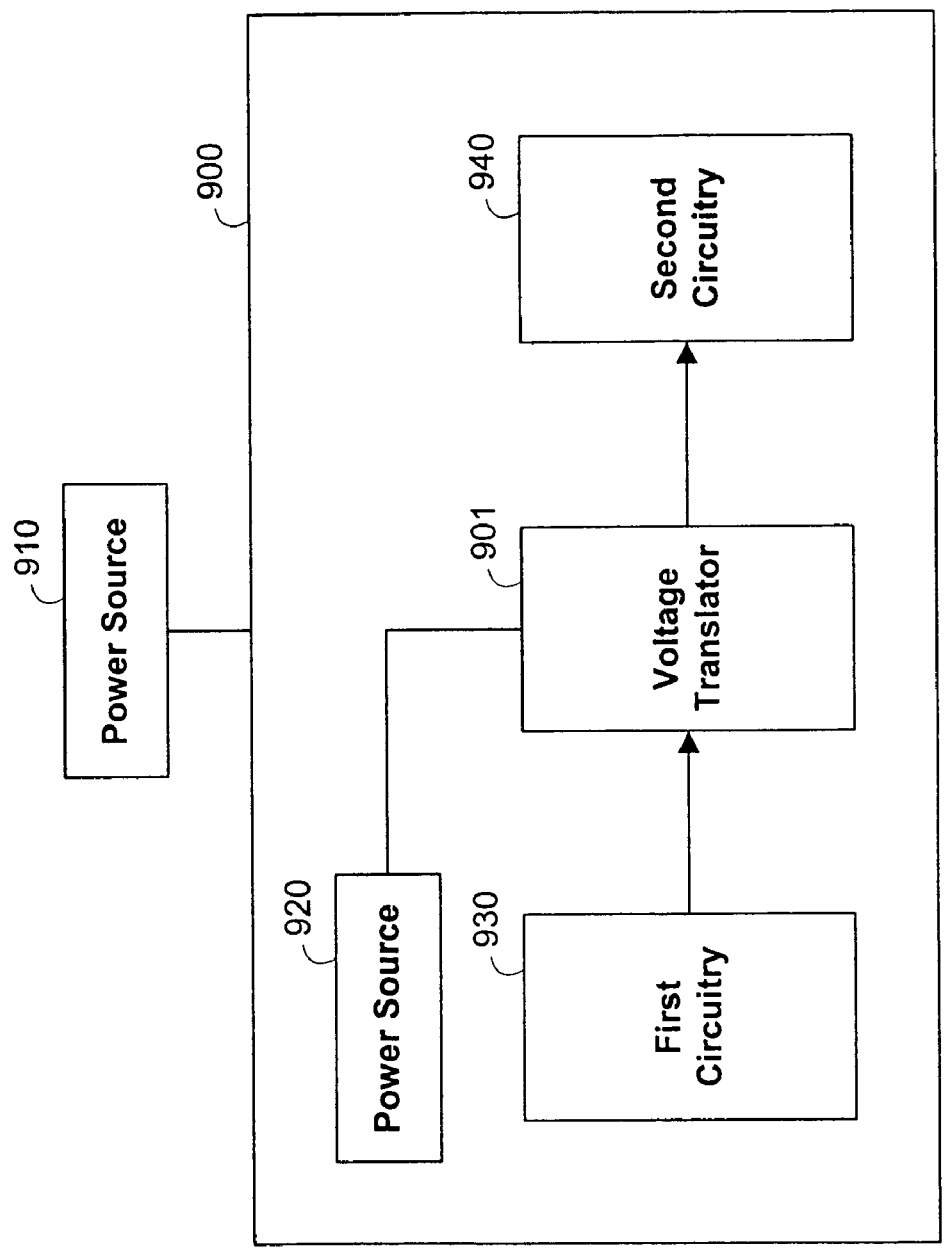
FIG. 9 is an illustrative integrated circuit using the voltage level translator according to the invention.

FIG. 9 shows an illustrative integrated circuit 900 utilizing voltage level translator circuitry 901 according to the invention. Integrated circuit 900 may be powered by an external power supply 910 that provides a low source voltage (e.g., 0.6 volts). In addition, an internal voltage source 920 may be provided within integrated circuitry 900 to provide a predetermined voltage level (e.g., $V_{BB}$ or $V_{CCP}$). Voltage level translator circuitry 901 may interface a first circuitry 930 that operates according to a first predefined voltage range (e.g., ground to source voltage) to a second circuitry 940 that operates according to a second predefined voltage range (e.g., ground to the predetermined voltage or source voltage to the predetermined voltage).

Figure 10:
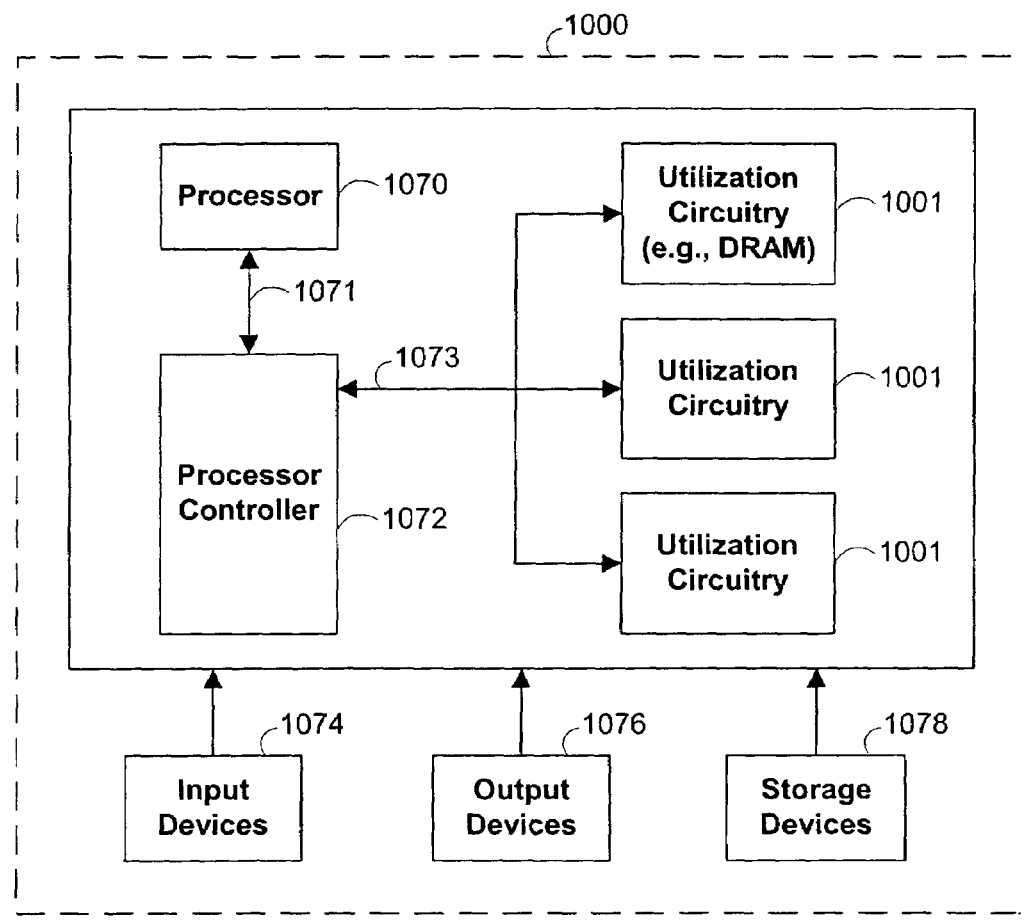
FIG. 10 is an illustrative block diagram of a system that incorporates the invention.

FIG. 10 shows a system that incorporates the invention. System 1000 includes a plurality of DRAM chips 1001, a processor 1070, a memory controller 1072, input devices 1074, output devices 1076, and optional storage devices 1078. Data and control signals are transferred between processor 1070 and memory controller 1072 via bus 1071. Similarly, data and control signals are transferred between memory controller 1072 and DRAM chips 1001 via bus 1073. Voltage level translation circuitry according to the invention may, for example, interface bus 1073 with DRAM 1001. Input devices 1074 can include, for example, a keyboard, a mouse, a touch-pad display screen, or any other appropriate device that allows a user to enter information into system 1000. Output devices 1076 can include, for example, a video display unit, a printer, or any other appropriate device capable of providing output data to a user. Note that input devices 1074 and output devices 1076 can alternatively be a single input/output device. Storage devices 1078 can include, for example, one or more disk or tape drives.

Thus, voltage level translation circuitry that operates at relatively low supply voltages is provided. One skilled in the art will appreciate that the present invention can be practiced by other than the described embodiments, which are presented for the purposes of illustration and not of limitation, and the present invention is limited only by the claims which follow.

What is claimed is:

1. A voltage translator, comprising:
   an output node; and
   circuitry that receives an input signal having a voltage potential, said circuitry operative to provide a HIGH voltage level and a LOW voltage level to said output node in response to the potential of said input signal, said circuitry comprising:
   a plurality of transistors that selectively couple said output node to said HIGH voltage level and said LOW voltage level; and
   voltage protection circuitry coupled to a portion of said plurality of transistors, said protection circuitry operative to prevent a difference in voltage across at least one of the transistors of said portion from exceeding a predetermined voltage level, wherein the difference in voltage across said at least one transistor is the difference between a first fixed source voltage level and a second fixed source voltage level.

2. The translator defined in claim 1, wherein said predetermined source voltage level is a voltage of at least 0.4 volts.

3. The translator defined in claim 1, wherein said predetermined source voltage level is a voltage that ranges from about 0.4 volts to about 0.8 volts.

4. The translator defined in claim 1, wherein said HIGH voltage level is a voltage greater in voltage than said first fixed source voltage level, and wherein said LOW voltage level is substantially equal to a ground voltage level, and wherein said second fixed source voltage is substantially equal to said HIGH voltage level.

5. The translator defined in claim 1, wherein said first fixed source voltage level is a ground level voltage, wherein said LOW voltage level is a voltage less than said ground voltage level, and wherein said HIGH voltage level is a voltage greater than said first fixed source voltage level, wherein said second fixed source voltage level is substantially equal to said HIGH voltage level.

6. The translator defined in claim 1, wherein said voltage protection circuitry comprises at least one transistor.

7. The translator defined in claim 1, wherein said portion of said plurality of transistors are thin gate oxide transistors.

8. The translator defined in claim 1, wherein the difference in voltage is voltage selected from the group consisting of drain-to-source voltage, source-to-drain voltage, gate-to-source voltage, source-to-gate voltage, drain-to-source voltage, source-to-drain voltage, and any combination thereof.

9. The translator defined in claim 1, wherein said HIGH voltage level is a voltage greater in voltage than said first fixed source voltage level, and wherein said LOW voltage level is substantially equal to a ground voltage level, and wherein said second fixed source voltage is substantially equal to said LOW voltage level.

10. The translator defined in claim 1, wherein said first fixed source voltage level is a ground level voltage, wherein said LOW voltage level is a voltage less than said ground voltage level, and wherein said HIGH voltage level is a voltage greater than said first fixed source voltage level, wherein said second fixed source voltage level is substantially equal to said LOW voltage level.

11. A voltage translator, comprising:
    an output node; and
    circuitry that receives an input signal having a voltage potential, said circuitry operative to provide a HIGH voltage level and a LOW voltage level to said output node in response to the potential of said input signal, said circuitry comprising:
a plurality of transistors that selectively couple said output node to said HIGH voltage level and said LOW voltage level;
voltage protection circuitry coupled to a portion of said plurality of transistors that prevents voltage being applied to said portion from exceeding a predetermined source voltage level;
a second output node that is selectively coupled to said HIGH voltage level and said LOW voltage level in response to an inverse of the potential of said input signal;
first buffer circuitry coupled to said output node; and
second buffer circuitry coupled to said second output node;
wherein said first and second buffer circuitry are operative to selectively couple said HIGH voltage level and said LOW voltage level to utilization circuitry.

12. A method for translating a voltage using a voltage level translator operating at a predetermined source voltage level, said method comprising:
receiving an input signal having a voltage potential;
selectively coupling an output node to either a HIGH voltage level and a LOW voltage level in response to the potential of said input signal, said coupling being performed by a plurality of transistors; and
preventing a difference in voltage across at least one of said plurality of transistors from exceeding a predetermined voltage level, wherein the difference in voltage across said at least one transistor is the difference between a first fixed source voltage level and a second fixed source voltage level.

13. The method defined in claim 12, wherein said predetermined source voltage level is a voltage of at least 0.4 volts.

14. The method defined in claim 12, wherein said predetermined source voltage level is voltage is a voltage that ranges from about 0.4 volts to about 0.8 volts.

15. The method defined in claim 12, wherein said HIGH voltage level is a voltage greater in voltage than said first fixed source voltage level, and wherein said LOW voltage level is substantially equal to a ground voltage level, and wherein said second fixed source voltage is substantially equal to said HIGH voltage level.

16. The method defined in claim 12, wherein said first fixed source voltage level is a ground level voltage, wherein said LOW voltage level is a voltage less than said ground voltage level, and wherein said HIGH voltage level is a voltage greater than said first fixed source voltage level, wherein said second fixed source voltage level is substantially equal to said HIGH voltage level.

17. The method defined in claim 12, wherein said portion of said plurality of transistors are thin gate oxide transistors.

18. The method defined in claim 12, wherein the difference in voltage is voltage selected from the group consisting of drain-to-source voltage, source-to-drain voltage, gate-to-source voltage, source-to-gate voltage, drain-to-source voltage, source-to-drain voltage, and any combination thereof.

19. The method defined in claim 12 further comprising:
buffering said HIGH voltage level and said LOW voltage level being coupled to said output node.

20. The translator defined in claim 12, wherein said HIGH voltage level is a voltage greater in voltage than said first fixed source voltage level, and wherein said LOW voltage level is substantially equal to a ground voltage level, and wherein said second fixed source voltage is substantially equal to said LOW voltage level.

21. The translator defined in claim 12, wherein said first fixed source voltage level is a ground level voltage, wherein said LOW voltage level is a voltage less than said ground voltage level, and wherein said HIGH voltage level is a voltage greater than said first fixed source voltage level, wherein said second fixed source voltage level is substantially equal to said LOW voltage level.

22. A system comprising:
a processor;
a processor controller coupled to said processor;
utilization circuitry coupled to said processor controller via voltage level translator circuitry, wherein said translator circuitry is operative to:
receive an input signal having a voltage potential from said processor controller;
selectively provide an output signal having either a HIGH voltage level or a LOW voltage level to said utilization circuitry in response to the potential of said input signal; and
prevent a difference in voltage across at least a portion of said translator circuitry from exceeding a predetermined voltage level, wherein the difference in voltage across said portion is the difference between a first fixed source voltage level and a second fixed source voltage level.

23. The system defined in claim 22, wherein said utilization circuitry is memory.

24. An integrated circuit that is supplied with a predetermined source voltage level, comprising
an output node;
input circuitry that receives an input signal having a voltage potential;
inverse input circuitry that receives an inverse of said input signal;
translation circuitry coupled to said input circuitry, said inverse input circuitry, said output node, and a voltage source having a predetermined HIGH voltage level, wherein said input circuitry, said inverse input circuitry, and said translation circuitry are operative to selectively couple said output node to a ground voltage level and said predetermined HIGH voltage level;
first voltage protection circuitry coupled to said input circuitry, said translation circuitry, and said predetermined source voltage level, and being operative to prevent the voltage being applied to a first portion of said translation circuitry and said input circuitry from exceeding said predetermined source voltage level; and
second voltage protection circuitry coupled to said inverse input circuitry, said translation circuitry, and said predetermined source voltage level, and being operative to prevent the voltage being applied to a second portion of said translation circuitry and said inverse input circuitry from exceeding said predetermined source voltage level.

25. The integrated circuit defined in claim 24, wherein said output node is coupled to said predetermined HIGH voltage level when said input signal has a voltage potential that is substantially equal to said predetermined source voltage level.

26. The integrated circuit defined in claim 24, wherein said output node is coupled to said ground voltage level when said input signal has a voltage potential that is substantially equal to said ground voltage level.

27. The integrated circuit defined in claim 24, wherein said first voltage protection circuitry is a transistor and wherein said second voltage protection circuitry is a transistor.

28. The integrated circuit defined in claim 24, wherein said predetermined source voltage level is VCC.

29. The integrated circuit defined in claim 24, wherein the voltage being applied to said first portion and said input circuitry is a voltage selected from the group consisting of drain-to-source voltage, source-to-drain voltage, gate-to-source voltage, source-to-gate voltage, drain-to-source voltage, source-to-drain voltage, and any combination thereof.

30. The integrated circuit defined in claim 24, wherein the voltage being applied to said second portion and said inverse input circuitry is a voltage selected from the group consisting of drain-to-source voltage, source-to-drain voltage, gate-to-source voltage, source-to-gate voltage, drain-to-source voltage, source-to-drain voltage, and any combination thereof.

31. The integrated circuit defined in claim 24, wherein said predetermined HIGH voltage level is a voltage higher in potential than said predetermined source voltage level.

32. Voltage level translation circuitry, comprising:
a first output node;
a second output node;
a cross-coupled circuitry coupled to a predetermined voltage level and to said first and second output nodes;
first and second input circuitry that receive an input signal having a voltage potential ranging from a LOW voltage level to a HIGH voltage level, said first and second input circuitry operating in connection with said cross-coupled circuitry to selectively couple said first and second output nodes to said predetermined voltage level and said LOW voltage level;
wherein said first input circuitry comprises:
a first transistor having its drain coupled to said second output node, its gate connected to said predetermined voltage level, and its source coupled to a first connection node;
a second transistor having its drain connected to said first connection node, its gate coupled to receive said input signal, and its source coupled to ground; and
a third transistor having its source coupled to said predetermined voltage level, its gate coupled to receive said input signal, and its drain is coupled to said first connection node, said third transistor operative to maintain said first connection node at said predetermined voltage level when said input signal is at said LOW voltage level; and
wherein said second input circuitry comprises:
a fourth transistor having its drain coupled to said first output node, its gate connected to said predetermined voltage level, and its source coupled to a second connection node;
a fifth transistor having its drain connected to said second connection node, its gate coupled to receive the inverse of said input signal, and its source coupled to ground; and
an sixth transistor having its source coupled to said predetermined voltage level, its gate coupled to receive the inverse of said input signal, and its drain is coupled to said second connection node, said sixth transistor operative to maintain said second connection node at said predetermined voltage level when said input signal is at said HIGH voltage level.

33. The circuitry defined in claim 32, wherein said first, second, fourth, and fifth transistors comprise n-channel transistors, and wherein said third and sixth transistors comprise p-channel transistors.

34. The circuitry defined in claim 32, wherein said cross-coupled circuitry comprises:
a seventh transistor having its source coupled to said predetermined voltage level, its gate coupled to said first output node, and its drain coupled to said second output node; and
an eighth transistor having its source coupled to said predetermined voltage level, its gate coupled to said second output node, and its drain coupled to said first output node.

35. The circuitry defined in claim 32, wherein said first, second, third, fourth, fifth, and sixth transistors comprise thin gate oxide transistors.

36. The circuitry defined in claim 32, wherein said HIGH voltage level is VCC.

37. The circuitry defined in claim 32, wherein said predetermined voltage level is VCCP.

38. An integrated circuit that is supplied with a predetermined source voltage level, comprising
an output node;
input circuitry that receives an input signal having a voltage potential;
inverse input circuitry that receives an inverse of said input signal;
translation circuitry coupled to said input circuitry, said inverse input circuitry, said output node, and a voltage source having a predetermined LOW voltage level, wherein said input circuitry, said inverse input circuitry, and said translation circuitry are operative to selectively couple said output node to a said predetermined source voltage level and said predetermined LOW voltage level;
first voltage protection circuitry coupled to said input circuitry, said translation circuitry, and ground, and being operative to prevent the voltage being applied to a first portion of said translation circuitry and said input circuitry from exceeding said predetermined source voltage level; and
second voltage protection circuitry coupled to said inverse input circuitry, said translation circuitry, and ground, and being operative to prevent the voltage being applied to a second portion of said translation circuitry and said inverse input circuitry from exceeding said predetermined source voltage level.

39. The integrated circuit defined in claim 38, wherein said output node is coupled to said predetermined source voltage level when said input signal has a voltage potential that is substantially equal to said predetermined source voltage level.

40. The integrated circuit defined in claim 38, wherein said output node is coupled to said predetermined LOW voltage level when said input signal has a voltage potential that is substantially equal to a ground voltage level.

41. The integrated circuit defined in claim 38, wherein said first voltage protection circuitry is a transistor and wherein said second voltage protection circuitry is a transistor.

42. The integrated circuit defined in claim 38, wherein said predetermined source voltage level is VCC.

43. The integrated circuit defined in claim 38, wherein the voltage being applied to said first portion and said input circuitry is a voltage selected from the group consisting of drain-to-source voltage, source-to-drain voltage, gate-to-source voltage, source-to-gate voltage, drain-to-source voltage, source-to-drain voltage, and any combination thereof.

44. The integrated circuit defined in claim 38, wherein the voltage being applied to said second portion and said inverse input circuitry is a voltage selected from the group consisting of drain-to-source voltage, source-to-drain voltage, gate-to-source voltage, source-to-gate voltage, drain-to-source voltage, source-to-drain voltage, and any combination thereof.

45. The integrated circuit defined in claim 38, wherein said predetermined LOW voltage level is a voltage lower in potential than said ground voltage level.

46. Voltage level translator circuitry, comprising:
   a first output node;
   a second output node;
   a cross-coupled circuitry coupled to a predetermined voltage level and to said first and second output nodes;
   first and second input circuitry that receive an input signal having a voltage potential ranging from a LOW voltage level to a HIGH voltage level, said first and second input circuitry operating in connection with said cross-coupled circuitry to selectively couple said first and second output nodes to said predetermined voltage level and said HIGH voltage level;
   wherein said first input circuitry comprises:
      a first transistor having its source coupled to a source voltage level, its gate coupled to receive said input signal, and its drain coupled to a first connection node;
      a second transistor having its source connected to said first connection node, its gate coupled to ground, and its drain coupled to said second output node; and
      a third transistor having its drain coupled to said first connection node, its gate coupled to receive said input signal, and its source coupled to ground, said third transistor operative to pull said first connection node to ground when said input signal is at said HIGH voltage level; and
   wherein said second input circuitry comprises:
      a fourth transistor having its source coupled to said source voltage level, its gate coupled to receive the inverse of said input signal level, and its drain coupled to a second connection node;
      a fifth transistor having its source connected to said second connection node, its gate coupled to ground, and its drain coupled to said first output node; and
      a sixth transistor having its drain coupled to said second connection node, its gate coupled to receive the inverse of said input signal, and its source coupled to ground, said third transistor operative to pull said second connection node to ground when said input signal is at said LOW voltage level.

47. The circuitry defined in claim 46, wherein said first, second, fourth, and fifth transistors comprise p-channel transistors, and wherein said third and sixth transistors comprise n-channel transistors.

48. The circuitry defined in claim 46, wherein said cross-coupled circuitry comprises:
   a seventh transistor having its source coupled to said predetermined voltage level, its gate coupled to said first output node, and its drain coupled to said second output node; and
   an eighth transistor having its source coupled to said predetermined voltage level, its gate coupled to said second output node, and its drain coupled to said first output node.

49. The circuitry defined in claim 46, wherein said first, second, third, fourth, fifth, and sixth transistors comprise thin gate oxide transistors.

50. The circuitry defined in claim 46, wherein said predetermined source voltage level is VCC.

51. The circuitry defined in claim 46, wherein said predetermined voltage level is VBB.

52. The circuitry defined in claim 46, wherein said predetermined source voltage level is substantially equal to said HIGH voltage level.

* * * * *

UNITED STATES PATENT AND TRADEMARK OFFICE
CERTIFICATE OF CORRECTION

| | | |
|---|---|---|
| PATENT NO. | : 7,071,730 B2 | |
| APPLICATION NO. | : 10/865725 | |
| DATED | : July 4, 2006 | |
| INVENTOR(S) | : Cordoba | |

It is certified that error appears in the above-identified patent and that said Letters Patent is hereby corrected as shown below:

Drawing Sheet 6, FIG. 5, replace second occurrence of numerical reference "558" located between reference "554" and reference "552" with numerical reference --556--.

Drawing Sheet 6, FIG. 5, delete connection from node between drain of transistor 512 and gate of transistor 504.

Drawing Sheet 6, FIG. 5, add connection from drain of transistor 512 to node between transistors 504 and 508.

Drawing Sheet 11, FIG. 8, add numerical reference --800-- to FIG. 8.

Column 2, line 4, insert --to-- after "according".

Column 2, line 42, insert --of-- before "such".

Column 3, line 37, change "provide" to --provided--.

Column 5, line 21, insert -- (-- before "e.g., $V_{CCP}$)".

Column 5, line 57, insert --be-- after "to".

Column 8, line 9, insert --to-- after "according".

Column 8, line 34, insert --to-- before "$V_{BB}$".

Column 9, line 53, insert --is-- before "obtained".

Column 10, line 67, delete "the" before "that".

UNITED STATES PATENT AND TRADEMARK OFFICE
CERTIFICATE OF CORRECTION

PATENT NO. : 7,071,730 B2
APPLICATION NO. : 10/865725
DATED : July 4, 2006
INVENTOR(S) : Cordoba It is certified that error appears in the above-identified patent and that said Letters Patent is hereby corrected as shown below:

Column 13, line 39, delete "is voltage" after "level".

Signed and Sealed this

Twenty-fourth Day of April, 2007

JON W. DUDAS
*Director of the United States Patent and Trademark Office*